United States Patent [19]

Haramoto et al.

[11] 4,072,914
[45] Feb. 7, 1978

[54] COMPRESSION AND EXPANSION SYSTEM WITH ENLARGED DYNAMIC RANGE

[75] Inventors: Yutaka Haramoto, Zama; Kazunori Nisikawa, Fujisawa; Masami Yamazaki, Zama, all of Japan

[73] Assignee: Victor Company of Japan, Ltd., Yokohama, Japan

[21] Appl. No.: 681,255

[22] Filed: Apr. 28, 1976

[30] Foreign Application Priority Data

Apr. 30, 1975 Japan .................................. 50-51261

[51] Int. Cl.$^2$ ............................................. H04B 1/64
[52] U.S. Cl. ...................................... 333/14; 179/1 P
[58] Field of Search ................ 179/1 D, 1 P, 100.4 C, 179/100.4 D; 333/14, 17 R

[56] References Cited

U.S. PATENT DOCUMENTS

| 3,795,876 | 3/1974 | Takahashi et al. | 333/14 |
| 3,873,945 | 3/1975 | Muraoka | 333/14 |
| 3,934,190 | 1/1976 | Dolby | 333/14 X |

Primary Examiner—Paul L. Gensler

[57] ABSTRACT

A compression and expansion system comprises a control circuit including a variable impedance element, whose impedance is varied in accordance with a control signal applied thereto. The system has a frequency-response characteristic which varies in accordance with variation of the impedance of the variable impedance element. A control signal is formed in accordance with the level of an input signal and is applied to the variable impedance element of the control circuit thereby to vary the impedance thereof. A switching means forms passing paths in a manner such that, at the time of compressing, the input signal is supplied by way of the control circuit to a negative feedback amplifier. At the time of expanding, the input signal is supplied to the negative feedback amplifier, and, at the same time, the output of the negative feedback amplifier is fed back by way of the control circuit to the input of said negative feedback amplifier. The control circuit comprises a variable high-frequency range increasing circuit which operates when the input signal level is relatively low. The control circuit increases the high-frequency component in accordance with the variation of the impedance of the variable impedance element. A variable high-frequency range decreasing circuit operates, when the input signal level is relatively high, to decrease the high-frequency component in accordance with the variation of the impedance of the variable impedance element.

7 Claims, 12 Drawing Figures

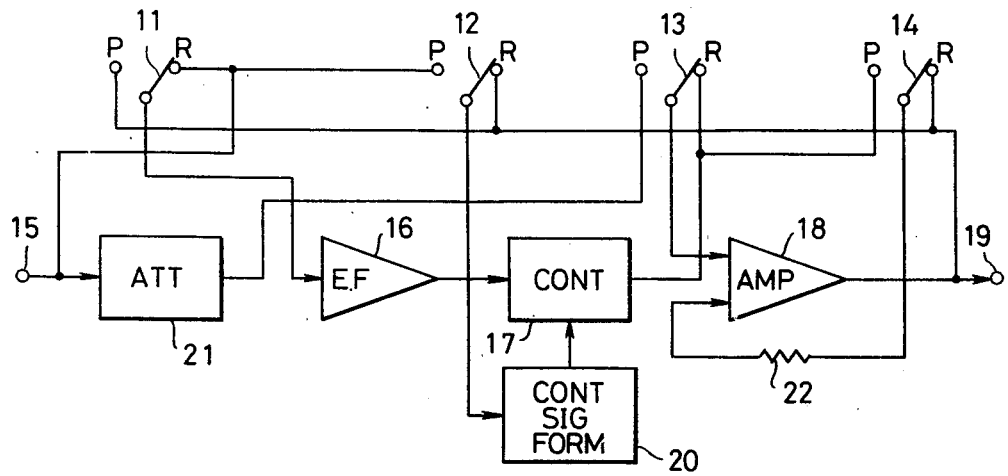
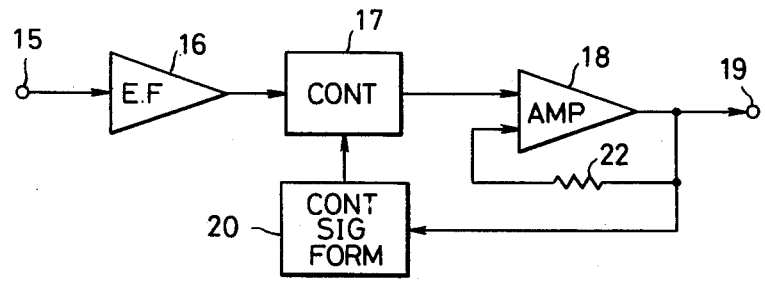
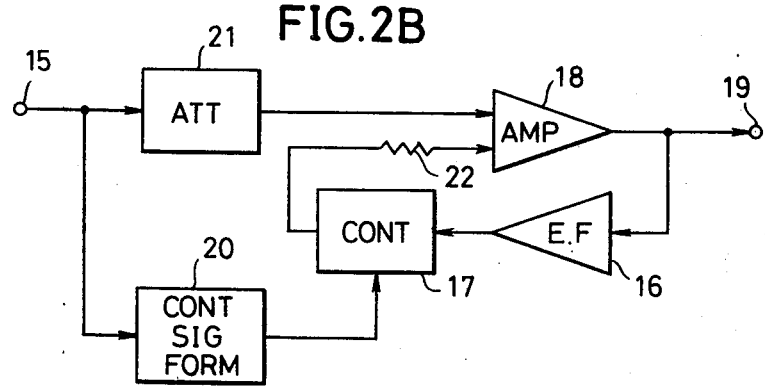

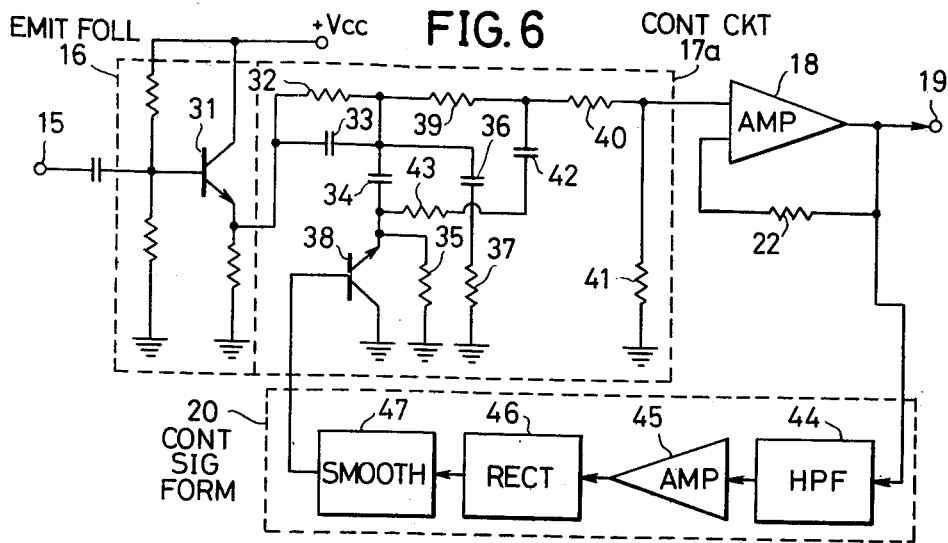
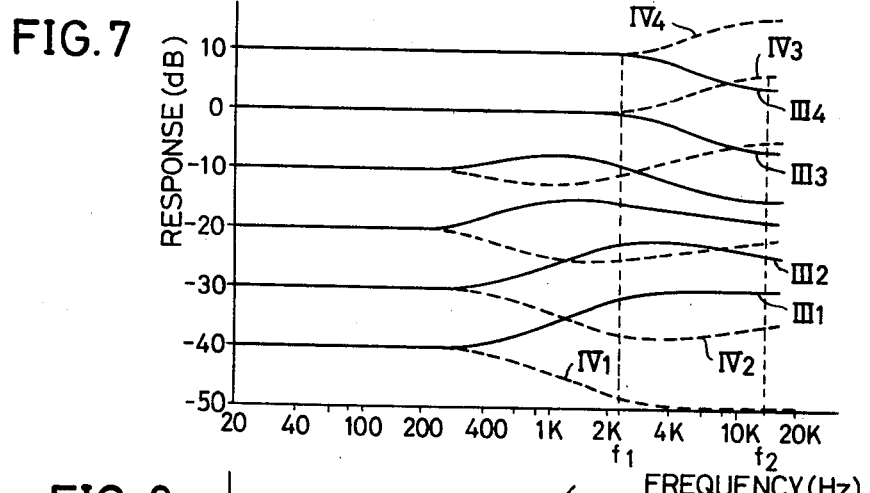
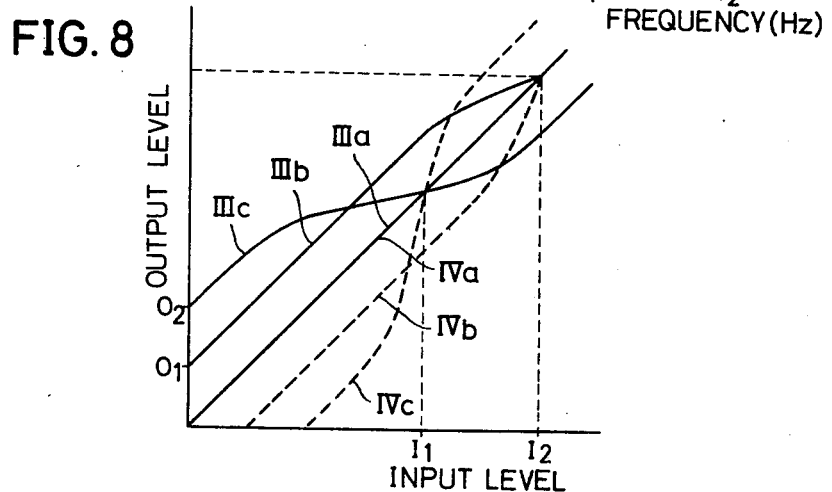

COMPRESSION AND EXPANSION SYSTEM WITH ENLARGED DYNAMIC RANGE

BACKGROUND OF THE INVENTION

The present invention relates generally to compression and expansion systems for transmitting signals with reduced noise, and more particularly to a compression and expansion system capable of enlarging the dynamic range of the high-frequency range of a transmitted signal.

A system called the Dolby S/N stretcher has been known in the prior art as a compression and expansion system for reducing noise. Another known system is the so-called ANRS system which has solved the problems accompanying the Dolby system. The ANRS system is disclosed in several publications such as, for example, the specification of U.S. Pat. No. 3,757,254.

The compressing part of each of these systems has a frequency characteristic wherein, as the level of the input signal becomes higher, the frequency characteristic of the output level in all frequencies becomes flatter. As the level of the input signal becomes lower, the level of the high-frequency range is increased in comparison with the level of the low-frequency range. In the expanding part of each of these systems, the level is to complement attenuated the above mentioned level increase, and the transmission characteristic in the entire system becomes flat. Moreover, the noise in the high-frequency range is reduced.

However, the saturation level of the input-output characteristic decreases with increasing signal frequency responsive to the relationship between the level of the input recording signal and the level of the output reproduced signal in a magnetic tape recording. Consequently, as the signal frequency becomes higher, the characteristic becomes saturated at a level which is not very high. The linearity of the proportional relationship between the input and output is lost.

As a consequence, each of the above mentioned compression and expansion systems has a dynamic range which cannot be large, particularly in the high-frequency range.

SUMMARY OF THE INVENTION

Accordingly, an object of the present invention is to provide a novel and useful compression and expansion system wherein the above described problems have been solved.

Another and more specific object of the invention is to provide a system for compressing and expanding, with an enlarged dynamic range of the high-frequency range. The system of the present invention can be applied with great effectiveness, particularly to signal transmission systems wherein the input-output characteristic, particularly in the high-frequency range, becomes saturated at a level which is not very high, as in a magnetic tape recording and reproducing system.

Still another object of the invention is to provide a compression and expansion system capable of transmitting signals with an enlarged dynamic range. Here, an object is to provide a simple circuit with a relatively small number of circuit elements.

Other objects and further features of the invention will be apparent from the following detailed description with respect to preferred embodiments of the invention when read in conjunction with the accompanying drawings.

BRIEF DESCRIPTION OF THE DRAWINGS

In the drawings:

FIG. 1 is a block diagram showing one embodiment of the compression and expansion system, according to the present invention;

FIGS. 2A and 2B are equivalent block diagrams of, respectively, the recording or compressing system, and the reproducing or expanding system, for use in a system illustrated in FIG. 1;

FIG. 6 is a circuit of a first embodiment of the recording system shown in FIG. 2A, according to the invention;

FIG. 7 is a graph indicating the frequency characteristics of response of the compressing and expanding systems of the system of the invention;

FIG. 8 is a graph indicating the input-output level characteristics of the compressing and expanding systems of the system of the invention;

DETAILED DESCRIPTION

Figure 3:
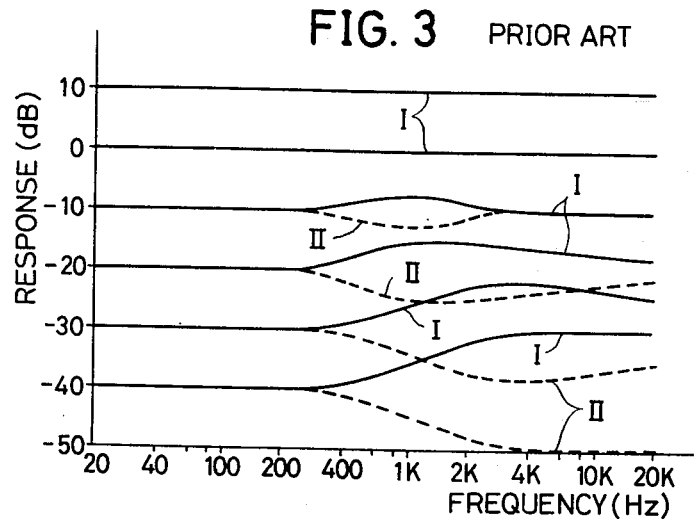
FIG. 3 is a graph indicating the frequency characteristics of the compressing system and the expanding system of a known system.

FIG. 1 is a block diagram of a recording and reproducing system of a tape recorder using one embodiment of the compression and expansion system. During recording the moving contacts of the changeover switches 11, 12, 13, and 14 are switched into contact with their respective contact points R. When an input recording signal from a microphone, is introduced into the system through an input terminal 15, it passes through the switch 11 and an impedance matching emitter follower circuit 16. Then it is supplied to a control circuit 17, constituting an essential part of the system of the invention. The signal from the control circuit 17 passes through the switch 13 and is fed to a negative feedback amplifier 18.

The output signal of the amplifier 18 is led out through an output terminal 19 and, at the same time, is supplied by way of the switch 12 to a control signal forming circuit 20. The output signal is negatively fed back by way of the switch 14 and a resistor 22 to the input of the amplifier 18. Consequently, the compressing system of the block diagram system of the recording system becomes equivalent to FIG. 2A.

The control signal forming circuit 20 produces an output control signal in accordance with the level of the signal from the amplifier 18. The control circuit 17 is controlled by this control signal. From the output terminal 19, a signal whose high-frequency range has been controlled as described hereinafter is led out and recorded on the magnetic tape, by a magnetic head (not shown).

During reproducing, the moving contacts of the switches 11 through 14 are switched into contact with their respective contact points P. A signal reproduced from the magnetic tape is supplied through the input terminal 15 respectively to an attenuator 21 and, further, through the switch 12 to the control signal forming circuit 20. The signal which has passed through the attenuator 21 is fed through switch 13 to the negative feedback amplifier 18.

The resulting output of the amplifier 18 is led out through the output terminal 19 and, at the same time, is fed through the switch 11 and the emitter follower circuit 16 to the control circuit 17. The signal is controlled in the control circuit 17 responsive to the control signal forming circuit 20. Thereafter, it is negatively fed back through the switch 14 to the amplifier 18. Accordingly, the expanding system of the block system of the reproducing system becomes equivalent to FIG. 2B. A reproduced signal which has been expanded and restored to its original frequency characteristic, and has had its noise suppressed, is led out through the output terminal 19 and supplied to a speaker (not shown).

The known compression and expansion system called the ANRS system, has a compressing system and an expanding system similar to those shown in FIGS. 2A and 2B. The control circuit 17 is adapted to compress and expand, as indicated respectively in FIGS. 3 and 4. More specifically, the compressing system provides a frequency-response characteristic in which the frequency-response characteristic becomes flatter, as the level of the input signal becomes higher. As the level of the input signal becomes lower, the response in the high-frequency range is increased, in comparison with the response in the low-frequency range. In the expanding system, expansion has a decreasing characteristic, complementary to that of the above mentioned full lines I, as indicated by the broken lines II in the same figure.

Figure 4:
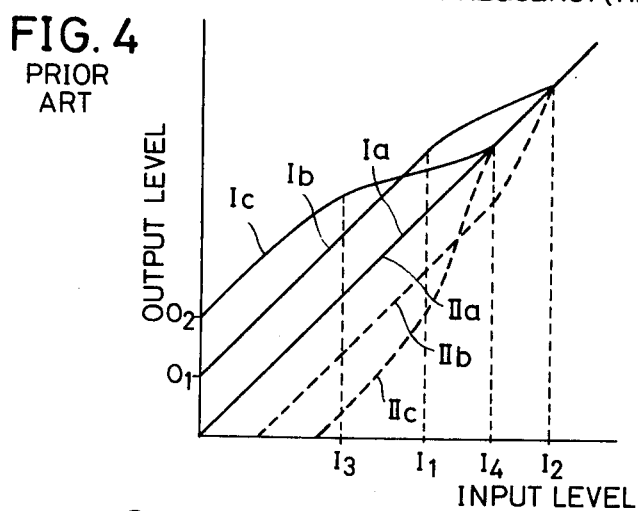
FIG. 4 is a graph indicating the input-output level characteristics of the compressing and expanding systems of a known system.

This can be indicated in FIG. 4 as the relationships between the input and output levels. Full lines Ia, Ib, and Ic respectively indicate the input and output level relationships with respect to the low-frequency, medium-frequency, and high-frequency ranges of the input signal in the compressing system. The broken lines IIa, IIb, and IIc respectively indicate the input and output level relationships with respect to the low-frequency, medium-frequency, and high-frequency ranges of the input signal in the expanding system.

Figure 5:
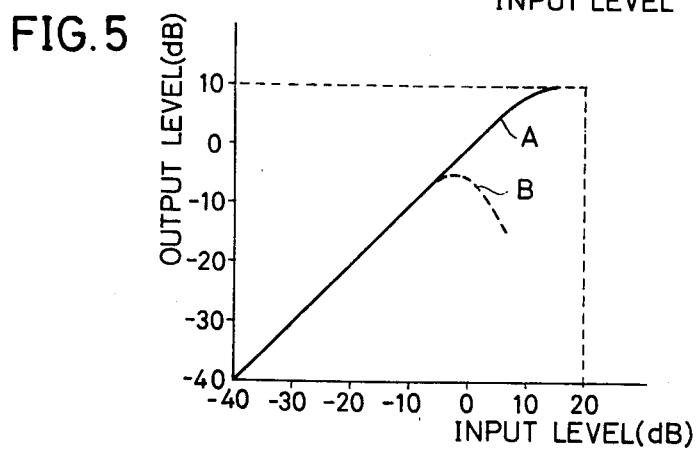
FIG. 5 is a graph indicating the recording-reproducing level characteristics of a magnetic tape.

In a magnetic tape, in general, the linearity of the reproduction level with respect to the recording level is as indicated by line A in FIG. 5 for the low-frequency range of a signal. The broken line B, in the same figure, shows the high-frequency range. As is also apparent from this figure, with respect to the high-frequency components of a signal, saturation takes place and linearity is lost at a level which is lower than the low-frequency component. This saturation level decreases with increasing signal frequency.

For this reason, it has not been possible to obtain a sufficiently large dynamic range in the high-frequency range, in the above described prior art compression and expansion system.

Accordingly, the present invention solves this problem by providing an improved organization and operation of the above mentioned control circuit 17, as described below.

FIG. 6 shows a first embodiment for use in the block diagram shown in FIG. 2A. A signal entering through the input terminal 15 passes through a transistor 31 of the emitter follower circuit 16 and is fed to a control circuit 17a. In this control circuit 17a, a parallel-connection of a resistor 32 and capacitor 33 is connected at one end to the emitter of the transistor 31. Between the other end of this parallel-connection circuit and ground, a series connection of a capacitor 34 and a resistor 35 and a series connection of a capacitor 36 and a resistor 37 are connected in a mutually parallel arrangement. The emitter and collector of an NPN transistor 38 are connected in parallel with the resistor 35. A signal from the control signal forming circuit 20 is applied to the base of the transistor 38. The resistor 32 is further connected by way of resistors 39 and 40 to the amplifier 18. A resistor 41 is connected between the resistor 40 and ground. A field-effect transistor may be used in place of the NPN transistor 38.

A series circuit consisting of capacitor 42 and resistor 43 is connected between the junction of the resistors 39 and 40 and the emitter of the transistor 38. The circuit comprising the resistors 39 and 43 and the capacitor 42 performs somewhat as a variable low-pass filter, in accordance with the conductive state of the transistor 38, as described hereinafter.

The output signal of the amplifier 18 is supplied to the control signal forming circuit 20, where it passes through a high-pass filter 44. The high-frequency component thus derived is successively amplified by an amplifier 45, rectified by a rectifying circuit 46, and smoothed by a smoothing circuit 47. The resulting voltage from the smoothing circuit 47 is applied to the base of the transistor 38 in accordance with the level of above mentioned high-frequency component.

An example of the circuit element constants in the above described control circuit 17a is as follows.

| Resistors: | | | | |
|---|---|---|---|---|
| 32 | 270 | kΩ | 40 | 15 kΩ |
| 35 | 5.6 | kΩ | 41 | 47 kΩ |
| 37 | 180 | Ω | 43 | 1.2 kΩ |
| 39 | 3.3 | kΩ | | |
| Capacitors: | | | | |
| 33 | 0.022 | μF | 36 | 0.018 μF |
| 34 | 0.1 | μF | 42 | 5600 PF |

If the level of the input signal entering the input terminal 15 is low, there is a low level of the control signal from the circuit 20, which is obtained from the high-frequency component of the output signal of the amplifier 18. The transistor 38 assumes its non-conductive state. Consequently, the impedance between the emitter and collector of the transistor 38 is high. At this time, the resistors 39 and 43 and the capacitor 42 have no effect, and the control circuit 17a operates somewhat as a variable high-pass filter. The high-frequency component of the input signal is increased by the control circuit 17a, as indicated by full-line curves III$_1$ and III$_2$ in FIG. 7, and the resulting signal is fed to the amplifier 18.

Then, as the input signal level becomes progressively higher, the output level of the control signal forming circuit 20 also becomes higher. The impedance between the emitter and collector of the transistor 38 gradually becomes lower. At this time, the control circuit 17a functions as a variable low-pass filter having a roll-off frequency f1 determined by the resistance values of the resistors 39 and 43 and the capacitance value of the capacitor 42. Circuit 17a also has a turn-over frequency f2 determined by the resistance value of the resistor 43 and the capacitance value of the capacitor 42. As a consequence, the high-frequency component of the input signal is decreased by the control circuit 17a, as indicated by full-line curves III₃ and III₄ in FIG. 7.

In the expanding system, the control circuit 17 shown in FIG. 2B is the same as the control circuit 17a shown in FIG. 6. As a result of feeding back the output signal of the control circuit 17a to the amplifier 18, the expanding characteristics are as indicated by intermittent-line curves IV$_1$, IV$_2$, IV$_3$, and IV$_4$, which are characteristically complementary to those indicated by full-line curves III$_1$ through III$_4$.

When these characteristics are represented as relationships of input and output levels, they become as indicated in FIG. 8. The full-line curves IIIa, IIIb, and IIIc respectively indicate the relationships of input and output levels of the low-frequency range (for example, 100 Hz), the medium-frequency range (for example, 1 KHz), and the high-frequency range (for example, 10 KHz) in the compressing system. In the expanding system, the relationships of input and output levels with respect to the low-frequency, medium-frequency, and the high-frequency ranges become as indicated by intermittent-line curves IVa, IVb, and IVc, which are complementary to the full-line curves IIIa, IIIb, and IIIc.

Therefore, the compression and expansion system operate in accordance with the input signal level. If the input signal level is relatively low, ordinary compressing and expanding are accomplished increasingly in the high-frequency range in the compressing system. The complementary attenuation of the high-frequency range, in the expanding system, is similar as in a known compression and expansion system. For this reason, when the input signal level is low, noises are effectively suppressed and reduced, such as the hiss of the magnetic tape, which is particularly perceptible. Furthermore, when the input signal level is relatively high, its high-frequency component is attenuated in the compressing system. The signal thus recorded is at a level below the saturation level on the magnetic tape. For this reason, it is possible to record and reproduce with a good linearity of the recording and reproducing levels over all frequency ranges, from the low-frequency range through the high-frequency range.

Figure 9:
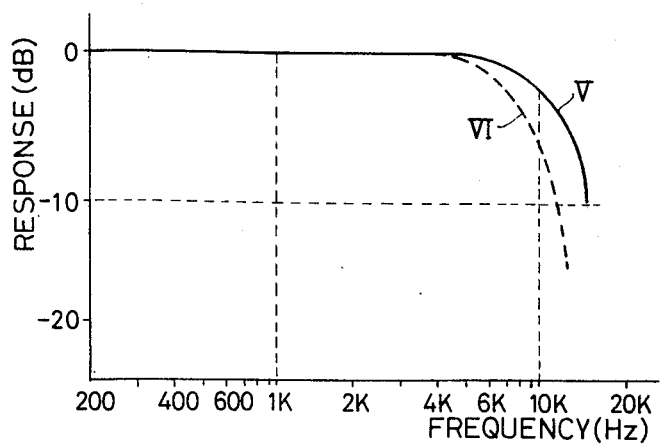
FIG. 9 is a graph indicating the frequency characteristics of response the reproduced signal where a signal is recorded on and reproduced from a magnetic tape by means of the compression and expansion system of the invention.

As a consequence, the recording and reproducing frequency characteristic of the system of the invention is as indicated by the full-line curve V in FIG. 9. This characteristic extends further into the high-frequency range than is provided by a known compression and expansion system as indicated by the intermittent-line curve VI in the same figure, and the dynamic range can be made wide. In this case, since the input signal level is high, the noise component is masked by the signal component even if the high-frequency component is attenuated somewhat, and no problem arises.

Figure 10:
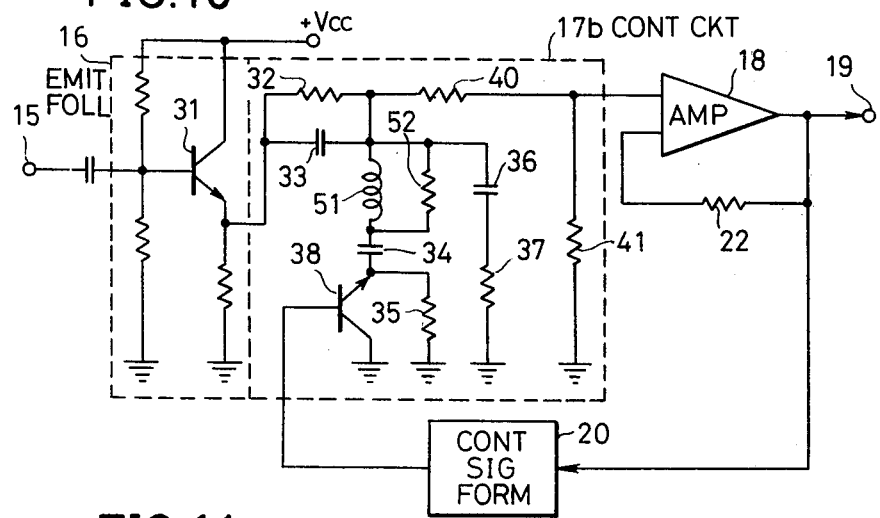
FIG. 10 is a circuit diagram of a second embodiment of the recording system shown in FIG. 2A.

A second embodiment 17b of the control circuit 17 is illustrated in FIG. 10. In this control circuit 17b, circuit parts which are the same as corresponding parts in the control circuit 17a illustrated in FIG. 6 are designated by like reference numerals, and detailed description of these parts will be omitted. In the instant embodiment, instead of the variable low-pass filter comprising the resistors 39 and 43 and the capacitor 42 (FIG. 6), a parallel-connection circuit comprising an inductor 51 and a resistor 52 is connected between the capacitor 34 and the junction between the resistors 32 and 40. The inductor 51, the capacitor 34, the resistor 35, and the impedance of the transistor 38 form a resonance circuit, and operate as a variable high band attenuation circuit.

When the input signal level becomes high, and the impedance between the emitter and the collector of the transistor 38 becomes low, there is a large quality factor Q of the resonance circuit comprising the inductor 51, the capacitor 34, the resistor 35, and the impedance of the transistor 38. When the input signal level becomes low, the impedance of the transistor 38 becomes large, and the quality factor Q of the resonance circuit becomes small. Accordingly, as a result of this increase and decrease in the quality factor Q of the resonance circuit, compressing and expanding operations similar to those indicated in FIGS. 7 and 8 are accomplished, similarly as in the preceding embodiment.

The inductance value of the inductor 51, for example, is selected to cause the resonance circuit to resonate at a desired frequency, which is determined by the inductor 51 and the capacitor 34. A selection of the resistance value of the resistor 52 sets the quantity of attenuation from the level of the flat characteristic in the high-frequency range, when the input signal level is high.

Figure 11:
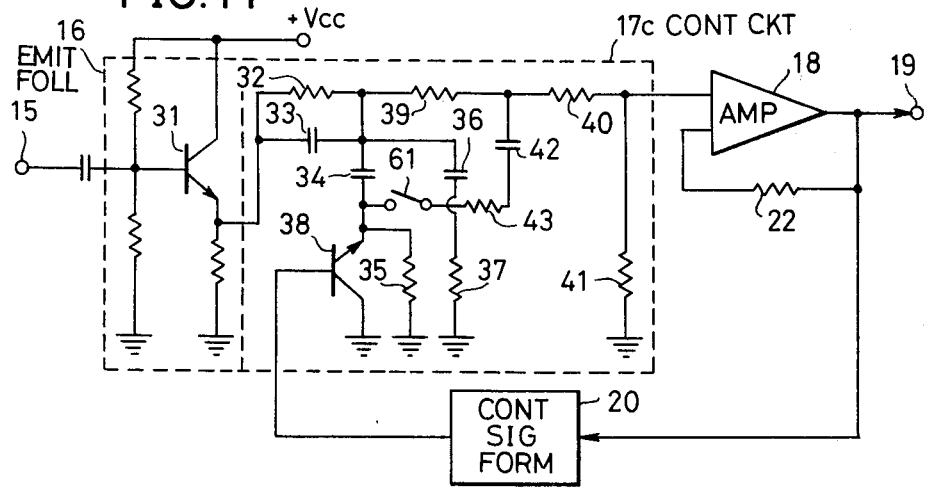
FIG. 11 is a circuit diagram of a third embodiment of the recording system shown in FIG. 2A.

A third embodiment 17c of the control circuit 17 is illustrated in FIG. 11. In this control circuit 17c, those circuit parts which are the same as corresponding parts in the control circuit 17a illustrated in FIG. 6 are designated by like reference numerals, and those parts will not be described again in detail. The circuit 17c is the same as the corresponding circuit shown in FIG. 6 except for the provision of an ON-OFF switch 61 between the resistor 43 and the emitter of the transistor 38. When this switch 61 is opened, control circuit 17c operates as a control circuit in a conventional compression and expansion system. When the switch 61 is closed, control circuit 17c operates in exactly the same manner as the control circuit 17a shown in FIG. 6.

Similarly, an ON-OFF switch may be connected between the two terminals of the inductor 51 in the control circuit 17b illustrated in FIG. 10. In this case, control circuit 17b operates in the same manner as a conventional control circuit when the switch is closed and operates as the control circuit 17b shown in FIG. 10 when the switch is opened.

It should be understood that the compression and expansion system of the present invention is not limited to recording and reproducing signals on magnetic tapes but is applicable to a signal transmission system having a characteristic such that the level at which saturation occurs in the high frequency range is lower than the level at which saturation occurs in the low-frequency range, whereby linearity is lost.

Further, this invention is not limited to these embodiments but variations and modifications may be made without departing from the scope and spirit of the invention.

What is claimed is:

1. A compression system comprising:
    means for changing a flat frequency characteristic to a characteristic which raises from said flat characteristic in a high-frequency range to a characteristic which lowers from the flat characteristic in a high-frequency range, said changes occurring in a manner such that said frequency characteristic approaches said raised characteristic as the level of an input signal becomes smaller and approaches said lowered characteristic as the level of the input signal becomes larger, said frequency characteristic changing means including a variable impedance element having an impedance which is varied responsive to a control signal, a variable high-frequency range increasing circuit means responsive to the variation of the impedance of said variable impedance element for relatively increasing the high-frequency component of the input signal in comparison with the low-frequency component thereof when said input signal is of a low level, and a variable high-frequency range decreasing circuit means responsive to the variation of the impedance of said variable impedance element for relatively decreasing the high-frequency component of said input signal in comparison with the low-frequency component thereof when said input signal is of a high level, said variable high-frequency range increasing circuit means and said variable high-frequency range decreasing circuit means being commonly connected to said single variable impedance element; and means for forming said control signal responsive to the level of said input signal of said frequency characteristic changing means and for applying said control signal to said variable impedance element of the control circuit means, thereby varying the impedance thereof.

2. A compression system as claimed in claim 1 in which said variable high-frequency range increasing circuit means comprises a variable high-pass filter, and said variable high-frequency range decreasing circuit means comprises a variable high attenuation filter.

3. a compression system as claimed in claim 1 in which said variable high-frequency range increasing circuit means comprises a variable high-pass filter, and said variable high-frequency range decreasing circuit means comprises a resonance circuit for decreasing a signal by resonance.

4. An expansion system for expanding signals which have been compressed by a compression system, which comprises:
 a control circuit means including a variable impedance element having an impedance which is varied responsive to a control signal, a variable high-frequency range increasing circuit means responsive to the variation of the impedance of said variable impedance element for increasing the high-frequency component of an input signal when said input signal is of a low level, and a variable high-frequency range decreasing circuit means responsive to the variation of the impedance of said variable impedance element for decreasing the high-frequency component of said input signal when said input signal is of a high level, said variable high-frequency range increasing circuit means and said variable high-frequency range decreasing circuit means being commonly connected to said single variable impedance element; and
 means for forming said control signal responsive to the level of said input signal and for applying said control signal to said variable impedance element of the control circuit means, thereby varying the impedance thereof;
 said expansion system comprising:
 an expansion control circuit means including a variable impedance element having an impedance which is varied responsive to an expansion control signal, a variable high-frequency range increasibng circuit means responsive to the variation of the impedance of said variable impedance element for increasing the high-frequency component of a signal transmitted from said compression system and introduced as an input into the expansion system when said input signal is of a low level, and a variable high-frequency range decreasing circuit means responsive to the variation of the impedance of said variable impedance element for decreasing the high-frequency component of said input signal when said input signal is of a high level, said variable high-frequency range increasing circuit means and said variable high-frequency range decreasing circuit means being commonly connected to said single variable impedance element;
 means for forming said expansion control signal responsive to the level of said input signal and for supplying said expansion control signal to said variable impedance element of the expansion control circuit means, thereby varying the impedance thereof; and
 a negative feedback amplifier circuit means responsvie to said input signal for producing an output signal which is negatively fed back by way of said expansion control circuit means.

5. A compression and expansion system comprising:
 a control circuit means including a variable impedance element having an impedance which is varied responsive to a control signal, a variable high-frequency range increasing circuit means responsive to the variation of the impedance of said variable impedance element for increasing the high-frequency component of an input signal when said input signal is of a low level, and a variable high-frequency range decreasing circuit means responsive to the variation of the impedance of said variable impedance element for decreasing the high-frequency component of said input signal when said input signal is of a high level, said variable high-frequency range increasing circuit means and said variable high-frequency range decreasing circuit means being commonly connected to said single variable impedance element;
 means for forming said control signal responsive to the level of said input signal and for applying said control signal to said variable impedance element of the control circuit means, thereby varying the impedance thereof;
 a negative feedback amplifier means; and
 switching means operated at the time of compressing for switching signal paths to supply said input signal through said control circuit means to said negative feedback amplifier means, and operated at the time of expanding to supply said input signal to said negative feedback amplifier means, and to feed back the output of said negative feedback amplifier means through said control circuit means to the input of said negative feedback amplifier means.

6. A compression and expansion system as claimed in claim 5 in which said variable high-frequency range increasing circuit means comprises a variable high-pass filter, and said variable high-frequency decreasing circuit means comprises a variable low-pass filter.

7. A compression and expansion system as claimed in claim 5 in which said variable high-frequency range increasing circuit means comprises a variable high-pass filter, and said variable high-frequency range decreasing circuit means comprises a resonance circuit for decreasing a signal by resonance.

* * * * *